(12) United States Patent
Hartman et al.

(10) Patent No.: US 8,795,837 B2
(45) Date of Patent: Aug. 5, 2014

(54) ADHESIVES WITH THERMAL CONDUCTIVITY ENHANCED BY MIXED SILVER FILLERS

(75) Inventors: Terence L Hartman, Londonderry, NH (US); Stavros Anagnostopoulos, Georgetown, MA (US); Peter Crudele, Danvers, MA (US)

(73) Assignee: Diemat, Inc., Byfield, MA (US)

( * ) Notice: Subject to any disclaimer, the term of this patent is extended or adjusted under 35 U.S.C. 154(b) by 187 days.

(21) Appl. No.: 12/674,062

(22) PCT Filed: Aug. 18, 2008

(86) PCT No.: PCT/US2008/009851
§ 371 (c)(1),
(2), (4) Date: Feb. 18, 2010

(87) PCT Pub. No.: WO2009/025787
PCT Pub. Date: Feb. 26, 2009

(65) Prior Publication Data
US 2011/0111234 A1 May 12, 2011

Related U.S. Application Data

(60) Provisional application No. 60/965,449, filed on Aug. 20, 2007.

(51) Int. Cl.
 - B32B 27/38 (2006.01)
 - B32B 27/20 (2006.01)
 - C09J 163/00 (2006.01)
 - C08K 3/08 (2006.01)
 - C08K 7/00 (2006.01)
 - C08K 13/04 (2006.01)
 - C08G 59/18 (2006.01)

(52) U.S. Cl.
USPC .......... 428/414; 156/330; 428/413; 523/442; 523/458

(58) Field of Classification Search
None
See application file for complete search history.

(56) References Cited

U.S. PATENT DOCUMENTS

| | | | |
|---|---|---|---|
| 3,716,489 A | 2/1973 | DeLapp | |
| 4,564,563 A | 1/1986 | Martin et al. | |
| 4,933,030 A | 6/1990 | Dietz | |
| 5,011,627 A | 4/1991 | Lutz et al. | |
| 5,238,507 A * | 8/1993 | Kugimiya et al. | 148/307 |
| 5,391,604 A | 2/1995 | Dietz et al. | |
| 5,480,957 A | 1/1996 | Muroi et al. | |
| 6,265,471 B1 | 7/2001 | Dietz | |
| 2005/0257643 A1 * | 11/2005 | Ogi et al. | 75/255 |
| 2005/0279970 A1 * | 12/2005 | Ogi et al. | 252/514 |
| 2007/0164260 A1 * | 7/2007 | Kuwajima | 252/512 |

FOREIGN PATENT DOCUMENTS

| | | | | |
|---|---|---|---|---|
| JP | 2004-111057 A | | 4/2004 | |
| JP | 2006-147378 A | | 6/2006 | |
| JP | 2004-071493 A | | 3/2007 | |
| WO | WO 98-39395 A1 | | 9/1998 | |
| WO | WO 2005031760 A1 * | | 4/2005 | H01B 5/00 |
| WO | WO 2007011331 A2 * | | 1/2007 | C23C 14/20 |

OTHER PUBLICATIONS

Definition of "oblong", provided by the Oxford English Dictionary (2013).*
"Understanding Thermal Performance Data: Improve your ability to recommend the right thermal interface material" a Dow Corning Case Study (2008).*
WO 2009/025787 PCT Search Report.

* cited by examiner

*Primary Examiner* — Michael J Feely
(74) *Attorney, Agent, or Firm* — Holtz Holtz Goodman & Chick PC

(57) ABSTRACT

A thermally conductive adhesive comprises a mixture of at least two types of silver particles including a second type having a surface area to mass ratio in the range of 0.59 $m^2/g$ to 2.19 $m^2/g$ and a tap density in the range of 3.2 to 6.9 $g/cm^3$ and a first type having a surface area to mass ratio of 0.05 to 0.15 $m^2/g$ and a tap density in the range of about 4.7 to 8.2 $g/cm^3$. According to certain embodiments of the invention the first type of silver particles includes oblong silver particles. The thermally conductive adhesive further comprises a binder, and optionally a solvent.

15 Claims, 2 Drawing Sheets

ADHESIVES WITH THERMAL CONDUCTIVITY ENHANCED BY MIXED SILVER FILLERS

FIELD OF THE INVENTION

The present invention relates generally to thermally conductive adhesives.

BACKGROUND

The invention described herein relates to an adhesive paste for bonding higher power devices to a substrate with a minimum of thermal resistance through the adhesive bondline and the method of use.

The attachment of active devices, such as semiconductor dies, to a substrate or in an electronic package has historically been accomplished using organic or inorganic adhesives. Typically, a semiconductor die is bonded to a substrate that is part of the semiconductor package. The adhesives that accomplish this bonding or attachment are usually in the form of a wet paste which consists of (1) a binder or adhesive component, (2) a filler, and (3) an optional diluent.

The purpose of the adhesive is to create a bond between the semiconductor device and the substrate. This adhesive layer between the device and substrate is often referred to as the bondline. Inorganic and organic binders have both previously been used. The most common inorganic binders are glass, solder, or a eutectic of Si and Au. Generally, this type of binder is used in inorganic packages, such as ceramic or metal. They are not generally adaptable to bonding die in plastic packages because of the high temperature processing required. The lowest attach temperature, for example, with Ag filled glass is about 300° C. as described in U.S. Pat. No. 4,933,030. This processing temperature, however, is too high for use with a plastic laminate package. On the other hand, the thermal conductivity of these inorganic adhesive systems is high, ranging about from 40 to 65 W/mK.

Organic binders are the most common type of binders used for die attach in plastic packages because of their low processing temperatures. However, the thermal conductivities of prior organic adhesive systems have been limited to about 3-4 W/mK, thus limiting the amount of heat dissipation possible in plastic packages.

Organic binders can be further classified into thermoset and thermoplastic. Thermoplastic organic binders are described in detail in U.S. Pat. No. 5,391,604. Thermosetting binders, as the name implies, "set up" or "crosslink" from a chemical reaction which can occur during a thermal excursion. Typically, a thermoset adhesive contains an epoxy resin, a hardener, a filler, and in many cases a small amount of reactive solvent. The function of the hardener is to crosslink with the epoxy resin and change from a liquid to a solid. More recently, as described in U.S. Pat. No. 5,480,957, the hardeners can be "latent" i.e., they do not react with the resins until well above room temperature. The use of a latent hardener extends the pot life or time at room temperature before the viscosity increases to an unacceptable level for dispensing as a result of room temperature crosslinking.

Other ingredients sometimes used in thermoset adhesives in combination with an epoxy resin include a reactive diluent or solvent. The reactive solvent is typically an unsaturated low viscosity monomer capable of crosslinking with the epoxy and becoming part of the hardened structure. It is used to lower the viscosity of the epoxy resin to allow more loading of the filler. Thus, in the case of electro-conductive adhesives, in which the filler usually is silver, higher electrical and thermal conductivities are realized. However, because of the lower molecular weight of the reactive solvent, only a limited amount can be used without sacrificing heat resistance and other functional properties. Thus, thermal conductivities have been limited to about 3-4 W/mK in prior art organic adhesives.

In some cases, a fugitive non-reactive solvent is used with an epoxy resin. For example, U.S. Pat. No. 3,716,489 describes a volatile solvent used to dissolve a photochromic material in an epoxy resin to form a transparent epoxy photochromic filter. Unlike the invention described herein, the above material is not used as an adhesive nor is it loaded with a particulate conductive filler.

U.S. Pat. Nos. 5,011,627 and 4,564,563 further describe screen printable electro-conductive pastes that include fugitive, non-reactive solvents that are used to dissolve the thermoplastic and epoxy resins. These examples, however, are used as conductive traces, such as on membrane keyboards, rather than adhesives and hence the solvents are easily evaporated before entrapment in the structure by the crosslinking. Thus, they could not be employed as adhesives wherein the solvents must be volatized from the bondline between the die and substrate before crosslinking occurs to avoid entrapment of the solvent and voids.

U.S. Pat. No. 6,265,471, assigned in common with the instant invention, provides an organic adhesive with a thermal conductivity an order of magnitude higher than those previously available, and, in addition, is easily dispensed and processed at low temperatures, provides a strong adhesive bond between the die and substrate, and good storage characteristics. U.S. Pat. No. 6,265,471 discloses a thermosetting adhesive paste comprising by volume:

a) about 15-75% of one part thermosetting liquid resin,
b) up to about 45% solvent, and
c) about 20-45% conductive filler.

Embodiments of the paste taught by the '471 patent, when cured, have an electrical resistivity less than about 50 μΩcm and a thermal conductivity greater than about 5 W/mK.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
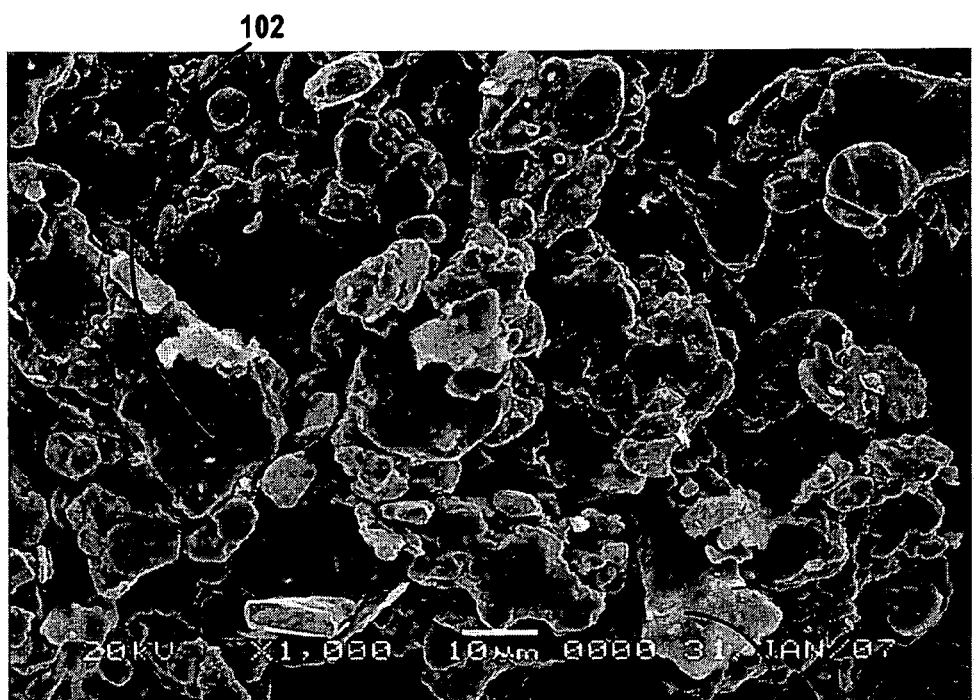
FIG. 1 is an electron micrograph of first type of silver powder used in embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

SUMMARY OF THE INVENTION

The current invention provides an organic adhesive that has a bulk thermal conductivity about 40% higher than those previously available, and, in addition, is easily dispensed and processed at low temperatures, provides a strong adhesive bond between the die and substrate, and has good storage characteristics.

This invention provides thermally conductive adhesive comprising by weight:

3-15% binder 0-15% solvent consisting essentially of non-reactive, solvent, at least 85% of thermally conductive filler The thermally conductive filler is a blend of two different powders including a second powder that has a tap density in the range of 3.2-6.9 g/cm$^3$ and a surface area to mass ratio of between 0.59 and 2.19 m$^2$/g and a first powder having a tap density between 4.7 and 8.2 g/cm$^3$ and a surface area to mass ratio between 0.05 and 0.15 m$^2$/g. The first powder and the second powder are preferably silver. Alternatively, one or both of the silver powders can be gold, nickel, copper, zinc, tin palladium and/or platinum.

According to one embodiment the binder includes a liquid epoxy resin that polymerizes upon curing. Although embodiments that include a solvent have achieved particularly higher thermal conductivities, alternatively no solvent is included. Benefits of not using a solvent include less settling of fillers during adhesive storage and use, less shrinkage and a reduced need for exhaust ventilation during curing, and the resulting higher binder content of the solvent-free versions can provide increased bond strengths. According to another alternative embodiment, a powder binder is used in lieu of the liquid epoxy binder. Typically, a powder binder would be used with a solvent. When used with a powder the solvent lends cohesiveness to the adhesive before it is cured. According to a further alternative in lieu of the above mentioned liquid epoxy which is a thermoset type material, a thermoplastic material is used. For example, a thermoplastic polymer may be used. Examples of thermoplastic polymers that may be used include polyesters, polyamides, polycarbonates, polyolefins and the like. According to still further embodiments rather than using an organic resin, a resin based on silicon chemistry, e.g., a polysilane type polymer can be used.

Thermally conductive adhesives according to the present invention have achieved performance levels substantially in excess of those taught by the commonly assigned '471 patent, to with, a thermal conductivity greater than about 60 W/mK has been achieved. An electrical resistivity less than about 10 μΩcm has also been achieved.

DETAILED DESCRIPTION

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Each of the principal components of the adhesive pastes of the present invention is described below and as an integral part of the unique paste system which provides unexpectedly high thermal properties.

Thermoset Binder/Hardener

A wide variety of known thermoset resins can be used in the present invention, and will be selected depending on the functional requirements of the cured material. Preferred are cycloaliphatic epoxy resins having a molecular weight of less than about 1000 g/mol and preferably less than about 500 g/mol. The low viscosity of the resin is attractive to allow a high percent loading of the filler at a reasonable viscosity without the use of a large amount of fugitive solvent. The viscosity of the thermoset resin is preferably between 200 and 2000 centipoise.

A hardener which is incorporated in the liquid resin should be latent, that is, is activated at temperatures greater than about 100° C. The specific hardener is selected to be effective at a temperature which is compatible with the solvent properties, as more fully discussed below. A resin with hardener system that delays the start of crosslinking to above 100° C., and has been found to be particularly satisfactory.

The latency of the curing or crosslinking is a key parameter of the system. Crosslinking must be delayed sufficiently in temperature to allow a sufficient amount of the solvent to be extracted or dried from the adhesive matrix. If too much crosslinking occurs before the solvent evolves from the adhesive, the solvent can become entrapped under the die in the three dimensional network that results from crosslinking. Thus, the relationship between the vapor pressure of any solvent used and the latency of the crosslinking is important.

According to certain embodiments a cycloaliphatic epoxy resin is combined with a latent hardener and a curing catalyst in an amount sufficient to minimize crosslinking below 100° C. to less than 15% after 1 hour and to allow at least 95% crosslinking at a temperature of 175° C. for 45 minutes. Curing catalysts and hardeners for use with the liquid cycloaliphatic epoxy resins may be selected from materials which are known to those skilled in the art.

It is preferable that the resin be substantially free of alkali and halide ions. If such ions are present in the cured adhesive product in a non-hermetic environment, they can migrate to the bond areas, resulting in undesirable conditions including corrosion.

According to certain embodiments the binder is limited to less than 10% by weight of the thermal adhesive (prior to curing) in order to allow for a high percentage of conductive filler to be used.

Solvent

A solvent used in the thermally conductive adhesive formulation is preferably characterized by the following general properties:

1) non-reactive with the resin, e.g., does not become part of the crosslinked epoxy system;

2) preferably the resin is soluble in the solvent;

3) non-bleeding, i.e., a slightly polar solvent with some surface tension is desirable to minimize the bleeding at the edge of the die attach fillet; and 4) moderate vapor pressure, i.e., a solvent that can be largely extracted from the matrix with elevated temperatures within a practical time. (Solvents with vapor pressure in the range of 0.01-0.02 mmHg @ 20° C. have been used with success)

Within these parameters, a wide variety of solvents can be used, including, for example, alcohols, ethers, esters and ketones. Non-soluble solvents tend to separate, increase the viscosity, and yield a poorly cured structure with the liquid epoxy resin based adhesives. The specific degree of solubility is not critical, although the less soluble solvents tend to dry or extract from the system more easily with heat. If the vapor pressure of the solvent is too high, the solvent tends to evaporate from the adhesive paste during preparation and storage at room temperature and hence increase the viscosity and degrade dispensing properties. If the vapor pressure is too low, the time required to extract or dry the solvent out of the resin matrix is impractically long. When the adhesive is under a large die, the rate of drying is further impeded, making the choice of solvent more critical.

For embodiments using a thermoplastic binder the solvent should be chosen such that the thermoplastic binder is insoluble in the solvent.

The specific solvent should be selected so that most of the solvent, and preferably greater than 90%, is extracted from the adhesive matrix before any significant crosslinking occurs. If the solvent extraction is not sufficient, the crosslinking can entrap the solvent in the matrix, causing voids in the bondline and poor adhesion. Preferably, the components are selected to limit crosslinking of the resin during initial drying to less than about 15% such that most of the solvent is evolved. Solvents found to be particularly satisfactory in the present invention are terpene or ester alcohols. According to certain embodiments the solvent has a vapor pressure sufficiently high to allow greater than about 75% of the solvent to evolve during a 100° C. prebake for 1 hour from under a die size of 0.400 inch per side.

The use of a solvent is preferred because the solvent can reduce the viscosity of the adhesive paste, permitting a higher loading of filler. Higher filler loading can be desirable because the resulting cured adhesive product can exhibit lower electrical resistivity and higher thermal conductivity. According to certain embodiments, the solvent is present in amount ranging from 4%, up to 7% by weight. However, useful formulations may also be prepared as solvent-free adhesive compositions.

Filler

The filler includes a mixture of at least two different powders. Although the chemical make up of the two different powders can and in the preferred embodiment are substantially the same (i.e., silver), the two powders differ in physical properties. The filler includes a first powder that has a tap density between 4.7 and 8.2 g/cm$^3$ and a surface area to mass ratio between 0.05 and 0.15 m$^2$/g and a second silver powder that has a tap density between 3.2 and 6.9 g/cm$^3$ and a surface area to mass ratio of between 0.59 and 2.19 m$^2$/g. According to certain embodiments of the invention, a ratio of the surface area per unit mass of the second powder divided by the surface area per unit mass of the first powder is at least four. The first powder and the second powder are preferably silver. Alternatively, one or both powders are selected from the group consisting of gold, nickel, copper, aluminum, zinc, tin, palladium and platinum. Generally, low surface area to mass ratios can be achieved by using powders made up of particles that having aspect ratios close to 1:1. However, according to embodiments of the present invention the first powder which has the lower surface area to mass ratio includes oblong particles. Generally speaking, oblong shaped silvers and/or a combination of flakes and oblong shaped silvers provide the highest volume loading of the filler in the paste. A combination of two powders having well separated average particle sizes, one large and one small, have been found to be particularly satisfactory. Stated another way a filler powder with a multimodal (e.g., bimodal) particle size (and surface area per unit mass) distribution has been found to be particularly satisfactory. According to certain embodiments the multimodal (e.g., bimodal) surface area per unit mass distribution has a first peak at a first surface area per unit mass value and a second peak at a second surface area per unit mass value and a ratio of the first surface area per unit mass value divided by the second surface area per unit mass value is at least four.

FIG. 1 is an electron micrograph of an example of the above mentioned first type of silver powder used in embodiments of the invention. The silver powder shown in FIG. 1 includes oblong particles 102 within the field of view.

Figure 2:
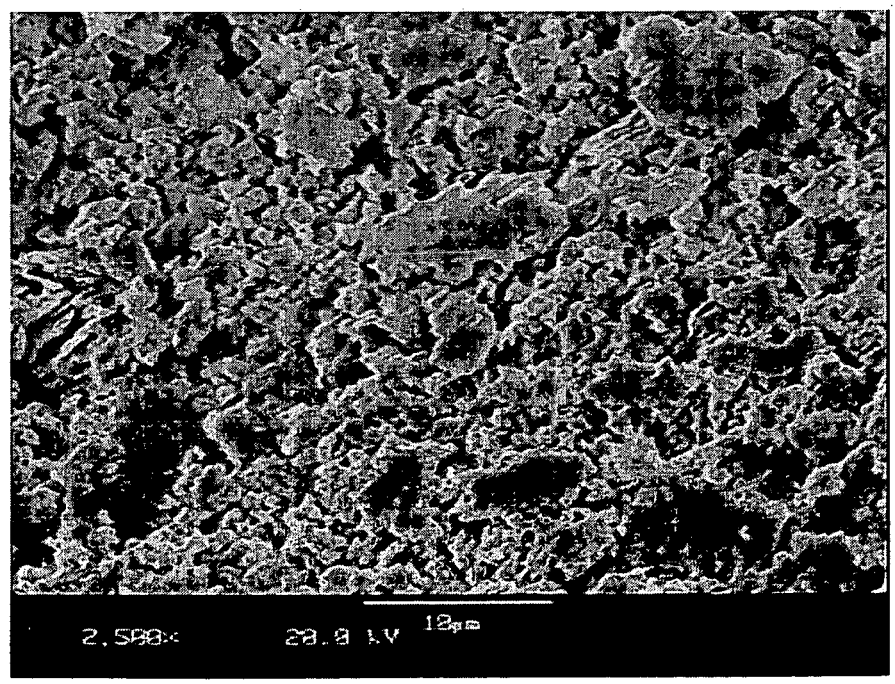
FIG. 2 is an electron micrograph of a second type of silver powder used in combination with the silver powder shown in FIG. 1 according to embodiments of the invention.

FIG. 2 is an electron micrograph of an example of the above mentioned second type of silver powder that is used in combination with the silver powder shown in FIG. 1 according to embodiments of the invention. Note the differences in the scale of FIG. 1 and FIG. 2 indicated by the 10 micron line in each FIG. The average particle size shown in FIG. 2 is substantially smaller than the average particle size shown in FIG. 1. The powders shown in FIG. 1 and FIG. 2 would each be largely responsible for one distribution peak (mode) in the multi-modal particle size distribution of a mixture of the two powders.

Figure 3:
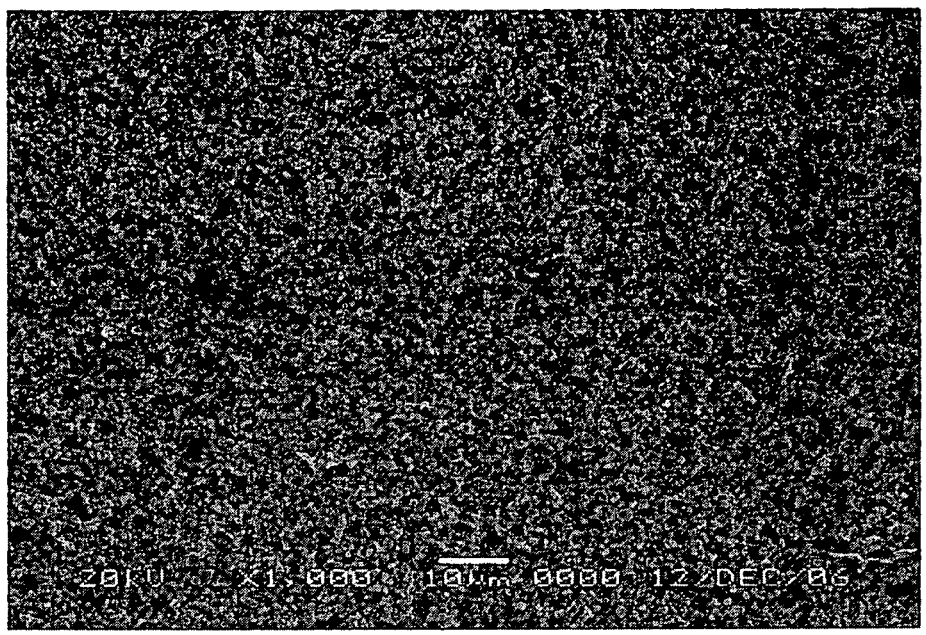
FIG. 3 is an electron micrograph of a third type of silver powder used in combination with the silver powder shown in FIG. 1 according to embodiments of the invention.

FIG. 3 is an electron micrograph of a third type of silver powder that can be used as an alternative to the silver powder shown in FIG. 2 in combination with the silver powder shown in FIG. 1 according to embodiments of the invention.

The particles of the powder shown in FIG. 2 are platy shaped in contrast to the particles of the powder shown in FIG. 3 which are more spherical in shape and have average aspect ratios closer to unity. It is noted that a combination of the powders shown in FIG. 1 and FIG. 2 in the thermal adhesives disclosed herein yielded more consistent mechanical bonds than a combination of the powders shown in FIG. 1 and FIG. 3.

Additives

Various additives can be combined with the pastes of the present invention to enhance certain properties of the adhesive such as modulus of elasticity, resin bleed, and thermal conductivity.

In attaching larger area silicon dies to a substrate, the interfacial shear stresses developed at the bondline interfaces can become severe if there is a large mismatch between the coefficients of expansion of the die and substrate. The shear stress developed is not only a function of the thermal expansion mismatch of the adjoining parts, but also of the modulus of elasticity of bondline material, i.e., the die attach material. Thus, it is very desirable to design the cured die attach material with a low modulus (resiliency) to absorb the stress created by the typical expansion mismatches of the die and the substrate. One way to accomplish this is to add small amounts of lower modulus elastomers, rubbers, silicone, thermoplastics, or the like in fine particle or liquid form.

Thermoplastics, in general, are much lower in modulus than thermosetting resins. The advantage of using thermoplastic powder is that it also contributes to the bonding by melting and forming an interpenetrating network (IPN) within the epoxy resin matrix.

Undesirable epoxy resin bleed on the edge of a deposit has sometimes been a functional problem with prior art. By the use of very high surface area, fine particles, this resin bleed was curtailed. In the present invention, very high surface area silver and silica can be used in small amounts to alleviate this problem. Too much of the very high surface area additive would increase the viscosity excessively or could adversely impact post cure properties such as conductivity and adhesion. An appropriate amount is in the range of 0.1% to 1.0% In addition, small amounts of viscosity modifiers (thickening agents), such as ethyl cellulose, can be incorporated in the composition to reduce edge bleeding. Typically, about from 0.5 to 1% by volume can be used effectively.

A small amount of fine conductive powders or fibers such as ceramics, diamond or other carbon-based materials can also be added to enhance the silver particle to particle thermal interface, thereby increasing the thermal conductivity of the cured adhesive.

Plasticizers and tackifiers can also be added to the thermal adhesive.

Examples 1-7

This invention is now illustrated by certain representative embodiments listed in Table I below. The examples are intended to be illustrative only, and modifications and equivalents of the invention will be evident to those skilled in the art. Examples 1-7 listed in Table I had a Cycloaliphatic epoxy resin binder, alcohol solvent, fumed silica and ethyl cellulose, the latter two being rheological additives. The thermally conductive adhesives of examples 1-7 were prepared by adding the resin to the solvent, then adding the silver powder filler and then mixing. Test samples using the thermally conductive adhesives were prepared by using the thermally conductive adhesive in an amount of 75 µL/in.$^2$ (11.6 µL/cm$^2$) to bond a 0.250 in. (6.35 mm) silicon die to an alumina substrate, drying the samples at 110° C. for 60 minutes followed by current the samples at 200° C. for 30 minutes. Samples thus prepared were used for shear force adhesion testing.

To test for thermal conductivity, thermal diffusivity pellets measuring 0.5" (12.7 mm) in diameter and 0.125" (3.175 mm) thick were molded in a Teflon mold. These pellets were dried at 90° C. for 105 minutes and cured at 200° C. for 60 minutes. The test method specified by ASTM E1461 was used for thermal conductivity testing via laser flash.

Table I above depicts that a blend of fine and coarse thermal filler can afford high thermal conductivity adhesives with optimum packing or relatively low porosity. In Table I 'Silver A' refers to the silver powder shown in FIG. 1, 'Silver B1' refers to the silver powder shown in FIG. 2 and 'Silver B2' refers to the silver powder shown in FIG. 3. As shown in the table all of the examples had in excess of 94% silver, in particular 95% silver. In the examples silver A is at least 30% of the total weight of silver A and silver B combined. As shown in the table the thermal conductivity of examples of the invention shown in columns 1-7 performed significantly better than the comparative example.

Figure 4:
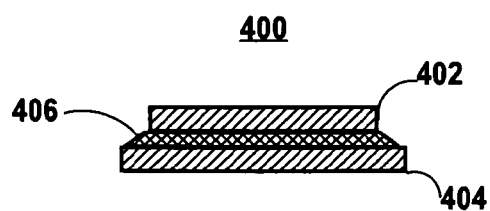
FIG. 4 is a sectional elevation view of a manufactured article using a thermally conductive adhesive according to an embodiment of the invention.

FIG. 4 is a sectional elevation view of a manufactured article 400. The article 400 includes a first part 402 adhered to a second part 404 using an amount of an adhesive 406 formulated according to the teachings of the invention. The first part 402 can for example comprise an active electronic or optoelectronic device, and the second part 404 can for example comprise a substrate such as an alumina, copper or a printed circuit board for example. The adhesive 406 provides for good heat transfer from the first part 402 to the second part 404 and thereby effectively allows the temperature rise of the first part 402 to be limited. Many electronic and optoelectronic devices require or benefit from operation at relatively lower temperatures.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential

TABLE I

| Silvers | Examples | | | | | | | comparative example 1 |
|---|---|---|---|---|---|---|---|---|
| | 1 | 2 | 3 | 4 | 5 | 6 | 7 | |
| Wt. % silver A (5.5-7.1 g/cm$^3$; 0.05-0.15 m$^2$/g) | 65 | 50 | 40 | 35 | 30 | 30 | 40 | |
| Wt. % silver B1 (3.2-4.2 g/cm$^3$; 0.85-1.35 m$^2$/g) | | | | | | 70 | 60 | |
| Wt. % silver B2 (4.6-6.0 g/cm$^3$; 0.70-1.90 m$^2$/g) | 35 | 50 | 60 | 65 | 70 | | | |
| Wt. % silver C (4.5-5.4 g/cm$^3$; 0.70-1.20 m$^2$/g) | | | | | | | | 50 |
| Wt. % silver D (3.2-5.7 g/cm$^3$; 0.30-0.75 m$^2$/g) | | | | | | | | 50 |
| Silver to binder ratio | 95/5 | 95/5 | 95/5 | 95/5 | 95/5 | 95/5 | 95/5 | 93/7 |
| Electrical resistivity (µΩcm) | 6.5 | 5.9 | 5.0 | 5.4 | 5.4 | 5.1 | 7.8 | 6.9 |
| Thermal conductivity (W/mK) | 71.6 | 88.1 | 97.0 | 94.7 | 94.5 | 72.4 | 74.3 | 55.4 |
| % porosity | 15.0 | 17.0 | 18.5 | 20.1 | 19.7 | 25.3 | 21.5 | 27.5 |
| Shear adhesion of 0.25" silicon die to alumina (psi) | 2295 | 2659 | 3082 | 2685 | 1826 | 2036 | 2914 | 2760 |
| Failure Mode (% cohesive) | 55 | 10 | 80 | 80 | 100* | 95 | 100 | 50 |

*Plus die fracture

We claim:

1. A thermally conductive adhesive comprising:
a liquid epoxy resin as a binder contained in an amount of 3% by weight to 15% by weight based on the thermally conductive adhesive;
a first silver powder including oblong particles and having a first surface area to mass ratio between 0.05 and 0.15 m$^2$/g; and
a second silver powder having a second surface area to mass ratio between 0.59 and 2.19 m$^2$/g,
wherein the total amount of the first silver powder and the second silver powder is at least 85% by weight based on the thermally conductive adhesive and the weight ratio of the first silver powder to the second silver powder is from 30/70 to 50/50.

2. The thermally conductive adhesive according to claim 1, wherein a quotient of said second surface area to mass ratio divided by said first surface area to mass ratio is at least 4.0.

3. The thermally conductive adhesive according to claim 1, wherein said first silver powder has a tap density between 4.7 and 8.2 g/cm$^3$.

4. The thermally conductive adhesive according to claim 3, wherein said second metal silver powder has a tap density between 3.2 and 6.9 g/cm$^3$.

5. The thermally conductive adhesive according to claim 1 further comprising a solvent.

6. The thermally conductive adhesive according to claim 5, wherein the solvent is selected from the group consisting of terpene and an ester alcohol.

7. The thermally conductive adhesive according to claim 5, wherein said binder is contained in an amount of 3% by weight to less than 10% by weight of said thermally conductive adhesive; and said solvent is contained in a positive amount of up to 7% by weight of said thermally conductive adhesive.

8. The thermally conductive adhesive according to claim 7, wherein said solvent is contained in an amount of from 4% up to 7% by weight of said thermally conductive adhesive.

9. The thermally conductive adhesive according to claim 7, wherein the solvent has a vapor pressure sufficiently high to allow greater than 75% of the solvent to evolve during a 100 degree C prebake for 1 hour under a die size of 0.400 inch per side.

10. The thermally conductive adhesive according to claim 1, wherein said liquid epoxy resin comprises a cycloaliphatic epoxy resin.

11. The thermally conductive adhesive according to claim 1, wherein said liquid epoxy resin further comprises a curing catalyst.

12. The thermally conductive adhesive according to claim 1, which is free of solvent.

13. A method of making a thermally conductive adhesive comprising:
providing a liquid epoxy resin as a binder contained in an amount of 3% by weight to 15% by weight based on the thermally conductive adhesive;
providing a first silver powder including oblong particles and having a first surface area to mass ratio between 0.05 and 0.15 m$^2$/g;
providing a second silver powder having a second surface area to mass ratio between 0.59 and 2.19 m$^2$/g; and
combining said binder, said first silver powder and said second silver powder,
wherein the total amount of the first silver powder and the second silver powder is at least 85% by weight based on the thermally conductive adhesive and the weight ratio of the first silver powder to the second silver powder is from 30/70 to 50/50.

14. The method according to claim 13 further comprising: providing a solvent and combining said binder and said solvent.

15. An apparatus comprising:
a first part;
a second part;
a thermally conductive adhesive bonding said first part to said second part, wherein said thermally conductive adhesive includes:
a liquid epoxy resin as a binder contained in an amount of 3% by weight to 15% by weight based on the thermally conductive adhesive;
a first silver powder including oblong particles and having a first surface area to mass ratio between 0.05 and 0.15 m$^2$/g; and
a second silver powder having a second surface area to mass ratio between 0.59 and 2.19 m$^2$/g,
wherein the total amount of the first silver powder and the second silver powder is at least 85% by weight based on the thermally conductive adhesive and the weight ratio of the first silver powder to the second silver powder is from 30/70 to 50/50.

* * * * *

UNITED STATES PATENT AND TRADEMARK OFFICE
CERTIFICATE OF CORRECTION

PATENT NO.       : 8,795,837 B2
APPLICATION NO.  : 12/674062
DATED            : August 5, 2014
INVENTOR(S)      : Terrence L. Hartman et al.

Page 1 of 1

It is certified that error appears in the above-identified patent and that said Letters Patent is hereby corrected as shown below:

On the Title page; Item (75) Inventor, line 1:

change "Terence" to --Terrence--.

Signed and Sealed this
Eleventh Day of November, 2014

Michelle K. Lee
*Deputy Director of the United States Patent and Trademark Office*